United States Patent [19]

Itatani

[11] Patent Number: 5,270,616
[45] Date of Patent: Dec. 14, 1993

[54] MICROWAVE PLASMA GENERATING APPARATUS

[75] Inventor: Ryohei Itatani, 11-18, Ohtaka-cho, Daigo, Fushimi-ku, Kyoto-shi, Kyoto, Japan

[73] Assignees: Ryohei Itatani, Kyoto; Idemitsu Petrochemical Company Ltd., Tokyo, both of Japan

[21] Appl. No.: 969,531

[22] Filed: Oct. 30, 1992

Related U.S. Application Data

[63] Continuation of Ser. No. 587,200, Sep. 24, 1990, abandoned.

[30] Foreign Application Priority Data

Sep. 25, 1989 [JP] Japan ................................. 1-248617

[51] Int. Cl.⁵ .............................................. H01J 7/24
[52] U.S. Cl. ........................... 315/111.21; 315/111.81; 313/231.31; 333/99 PL
[58] Field of Search ....... 315/111.21, 111.71, 315/111.81; 313/231.31; 333/99 PL; 204/298.38

[56] References Cited

U.S. PATENT DOCUMENTS

| 4,728,910 | 3/1988 | Owens | 333/99 PL X |
| 4,866,346 | 9/1989 | Gaudreau et al. | 315/111.21 |
| 5,003,152 | 3/1991 | Matsuo et al. | 204/298.38 X |
| 5,038,713 | 8/1991 | Kawakami et al. | 315/111.71 X |

FOREIGN PATENT DOCUMENTS

| 0311696 | 4/1989 | European Pat. Off. |
| 2408972 | 8/1979 | France |

*Primary Examiner*—Robert J. Pascal
*Assistant Examiner*—Michael B. Shingleton
*Attorney, Agent, or Firm*—Nikaido, Marmelstein, Murray & Oram

[57] ABSTRACT

A microwave plasma generating apparatus radiates a microwave to a source gas to produce a plasma. A plurality of spaced fins are disposed in a path of travel of the microwave, from the microwave guide to an area of origin of the plasma within the plasma generating chamber to lie in a direction perpendicular to the direction of an electric field of the microwave, for the purpose of locking the position at which the plasma has been produced.

15 Claims, 10 Drawing Sheets

RADIATING DIRECTION OF MICROWAVE

RADIATION DIRECTION OF MICROWAVE

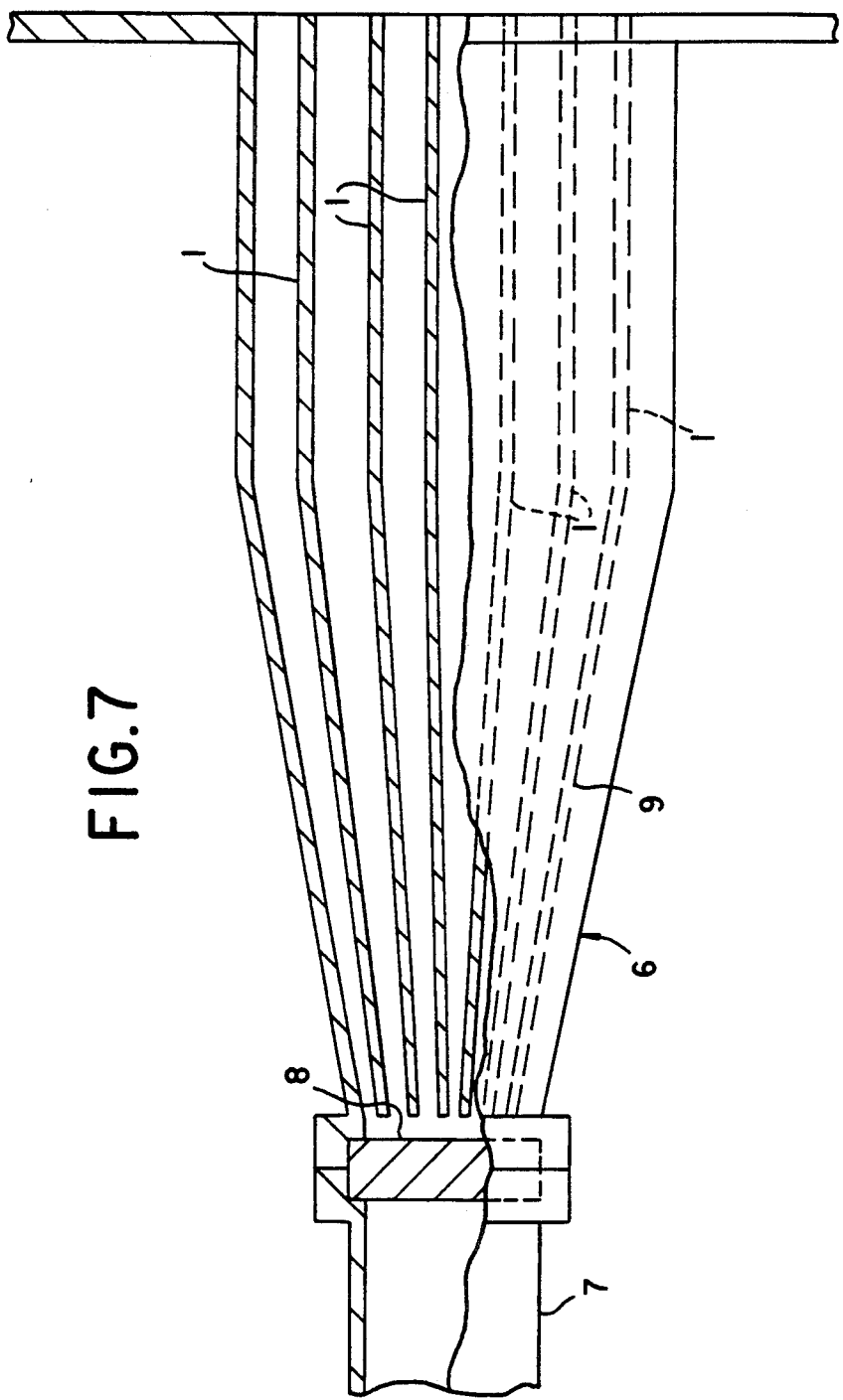

MICROWAVE PLASMA GENERATING APPARATUS

This application is a continuation of application Ser. No. 587,200 filed Sep. 24, 1990 and now abandoned.

BACKGROUND OF THE INVENTION

1. Field of the Invention

The present invention generally relates to a microwave plasma generating apparatus and, more particularly, to the microwave plasma generating apparatus of a simple structure wherein plasma generated as a result of microwave radiation can be positioned at a predetermined location.

2. Description of the Prior Art

A microwave plasma generating apparatus is well known which comprises a microwave oscillator for generating a microwave, a microwave guide for guiding the microwave therethrough, and a discharge tube containing a source gas. This known microwave plasma generating apparatus is so designed and so operated that plasma can be generated when the source gas within the discharge tube is radiated with the microwave generated by the microwave generator and subsequently guided through the microwave guide. In this known microwave plasma generating apparatus, energies of microwaves can be absorbed by the plasma generated within the discharge tube with the consequence that the microwave power can be maximized at a region of the plasma adjacent a microwave inlet.

Accordingly, once the microwave power is maximized, at the specific region adjacent the microwave inlet, the position at which the plasma is generated tends to shift towards a specific region and, as a result of the shift in position, the plasma is brought into contact with the discharge tube causing the latter to rupture.

Another type of microwave plasma generating apparatus is well known wherein, a plasma generating chamber is used in place of the plasma discharge tube. The chamber has a crystal pane through which a microwave is introduced into the chamber. In this type of microwave plasma generating apparatus, by a similar reason as discussed above, the position at which the plasma is generated tends to shift to the area where an electric field developed by the microwave is intensified. This shift in area of origin of the plasma causes the plasma to contact the crystal pane and, by the action of heated evolved by the plasma, the crystal pane tends to be thermally broken.

Where the microwave plasma generating apparatus is used as a plasma CVD (chemical vapor deposition) device, a substance produced by plasma reaction is often deposited on the crystal pane during the chemical vapor deposition. The consequence is that the microwave tends to be absorbed by the substance or semiconductor substance which has been deposited on the crystal pane, resulting in a reduction of the efficiency of propagation of the microwave towards the plasma generating chamber and, in the worst case it may happen, the plasma will fail to generate.

To obviate the foregoing problems, an attempt has been made to provide a sophisticated microwave plasma generating apparatus which comprises a microwave oscillator, a tubular microwave guide through which a microwave generated by the microwave oscillator propagates, a discharge tube operable to produce a plasma when a source gas introduced into the discharge tube is radiated with the microwave guided through the tubular microwave guide and into the discharge tube, and a tuner or movable stub turner operatively coupled with the discharge tube and having a short plunger which can reflect the microwave emitted from that exit of the tubular microwave guide which is coupled with the discharge tube and introduced into the discharge tube. The short plunger used in this microwave plasma generating apparatus includes a baffling or reflecting plate means supported for reciprocating motion in a direction generally parallel to the direction of propagation of the microwave.

This sophisticated microwave plasma generating apparatus is so designed that, when the baffling or reflecting plate means disposed so as to allow the discharge tube to locate between the opening of tube and the opening of wave guide reflects the incoming microwave, a reflected component of the microwave can interfere with the remaining microwave to provide a standing microwave at a predetermined area within the discharge tube thereby to fix the area of origin of the plasma within the discharge tube.

However, the employment of the baffling or reflecting plate means movable in a direction parallel to the direction of propagation of the microwave has been found problematic in that an increase of the applied electric power results in a shift of the plasma towards a source of microwave, that is, towards the microwave oscillator, and even in the case where no large amount of electric power is applied, the plasma tends to move slowly, but steadily towards the source of the microwave.

Accordingly, where a large amount of electric power is employed to generate the plasma and/or where the generation of the plasma is retained for a substantially prolonged length of time, it often occurs that the transmission force of the microwave is lowered consequent upon rupture of the wall defining the discharge tube and/or deposition of the plasma reaction product on the crystal pane.

It is to be noted that the microwave plasma generating apparatus of the type utilizing the short plunger requires the use of a drive system for driving the baffling or reflecting plate means in the direction generally parallel to the direction of propagation of the microwave and, therefore, it has an additional problem in that the device itself tends to become bulky.

SUMMARY OF THE INVENTION

The present invention has been developed with a view to substantially obviating the above discussed problems inherent in the prior art microwave plasma generating apparatus and is intended, as a primary object thereof, to provide an improved microwave plasma generating apparatus of a simple structure designed to avoid any possible shift in area of origin of the plasma, that is generated by the radiation of the microwave, towards the source of the microwave.

Another important object of the present invention is to provide an improved microwave plasma generating apparatus of the type referred to above, wherein the area of origin of the plasma, that is, the area at which the plasma is generated as a result of the microwave radiation, is spaced a distance from the window mounted with the crystal pane for the propagation of the microwave therethrough or the inner wall defining the discharge tube, thereby to avoid any possible rupture of the window or the discharge tube.

In order to accomplish the above described objects, the present invention is directed to a microwave plasma generator of a type which comprises a microwave oscillator for generating a microwave, a microwave guide for the propagation of the micorwave therethrough from the microwave oscillator, and a chamber defining means for defining a plasma generating chamber in which a source gas is radiated by the incoming microwave to produce a plasma. In accordance with a feature of the present invention, the microwave, plasma generating apparatus of the construction described above comprises a plurality of spaced fins disposed in a path of travel of the microwave from the microwave guide to an area of origin of the plasma within the plasma generating chamber so as to extend in a direction perpendicular to the direction of an electric field of the microwave.

BRIEF DESCRIPTION OF THE DRAWINGS

In any event, the present invention will become more clearly understood from the following description of preferred embodiments thereof, when taken in conjunction with the accompanying drawings. However, the embodiments and the drawings are given only for the purpose of illustration and explanation, and are not to be taken as limiting the scope of the present invention in any way what so ever, which scope is to be determined solely by the appended claims. In the accompanying drawings, like reference numerals are used to denote like parts throughout the several views, and:

FIG. 7 is a longitudinal sectional view, with a portion cut away, showing one example of an antenna horn used in the microwave plasma generating apparatus according to the present invention;

DETAILED DESCRIPTION OF THE EMBODIMENTS

The present invention will now be described in connection with some preferred embodiments with reference to the accompanying drawings.

Figure 1:
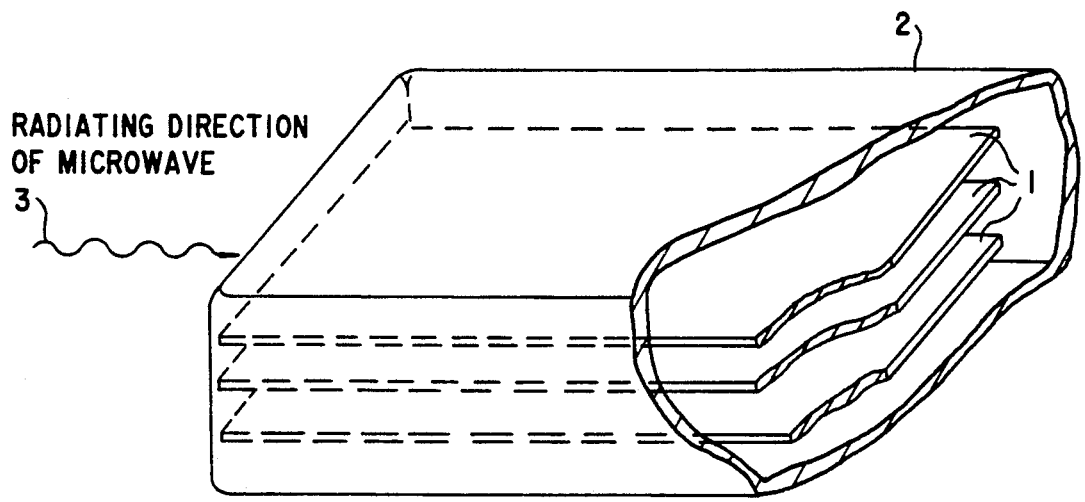
FIG. 1 is a perspective view, with a portion cut away, showing a plurality of fins disposed in a path of travel of a microwave in a microwave plasma generating apparatus according to a first preferred embodiment of the present invention.

As shown in FIG. 1, a microwave plasma generating apparatus according to a first preferred embodiment of the present invention shown therein includes a plurality of spaced fins generally identified by 1. These fins 1 are disposed within a generally tubular housing 2 having microwave inlet and outlet defined at opposite ends thereof, respectively, and through which a microwave 3 is guided in one direction from a microwave oscillator. As shown therein, the fins 1 within the tubular housing 2 extend parallel to the direction of travel of the microwave 3 through the tubular housing 2 and are so disposed and so oriented as to lie perpendicular to the direction of an electric field developed by the microwave within the tubular housing 2. Thus, the microwave 3 entering the microwave inlet of the tubular housing 2 travels through an interstice defined between each neighboring fins 1 and then towards the microwave outlet of the tubular housing 2 opposite to the microwave inlet. Where a source gas exists in the vicinity of the microwave outlet, the source gas will be radiated with and subsequently excited by the microwave emerging outwardly from the microwave outlet to produce a plasma.

Plasma generates in an area where a strength of electric field of microwave is maximum in a discharge tube. After generating plasma, the power of the microwave in the plasma is consumed for retaining the plasma and for plasma reaction. Therefore, the power of the microwave in the plasma becomes lower than a power of a microwave in an area where plasma does not generate in source gas. Then generating plasma starts to transfer its own position along the direction of propagation of the microwave toward microwave oscillator and approaches the fins 1. Even though the plasma contacts the fins 1 consequent upon the approach of the area of origin of the plasma towards the fins 1, the presence of the fins 1 is effective to prevent the plasma 1 from passing from the microwave outlet towards the microwave inlet of the tubular housing 2 and, hence, the movement of the plasma is effectively inhibited by the presence of the fins 1, allowing the area of origin of the plasma to be locked at a location adjacent the microwave outlet of the tubular housing 2.

The reason that the area of origin of the plasma, that is, the position at which the plasma is generated as a result of the source gas having been radiated with the microwave, can advantageously be locked by the presence of the fins on the path of travel of the microwave will now be discussed.

Briefly speaking, the purpose for which the plural fins are disposed on the path of travel of the microwave is to divide the path of travel of the microwave into a corresponding number of passages so that, upon contact of the plasma with respective ends of the fins adjacent the microwave outlet, a loss can occur in the plasma to such an extent that no plasma can be retained in the interstice between each neighboring fins.

Figure 2:
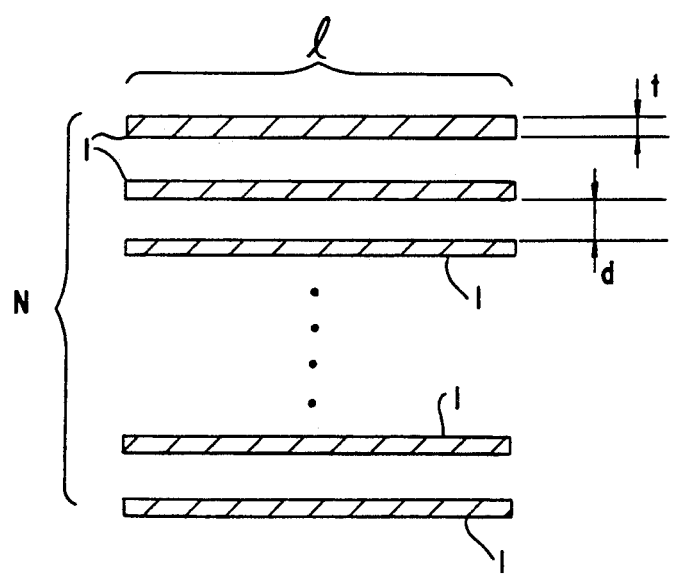
FIG. 2 is a schematic sectional view used for the purpose of explaining the principle of operation of the plural fins to inhibit a propagation of the plasma.

More specifically, as shown in FIG. 2, let it be assumed that the sectional area taken along the direction of propagation of a microwave (which sectional area has a height expressed by L) is divided by a certain number N of fins 1 and that the microwave travels in a direction from a left-hand portion of FIG. 2 towards a right-hand portion of FIG. 2. If the ionization frequency is expressed by $vi$, the coefficient of ambipolar diffusion of the ions is expressed by Da, and the characteristic length is expressed by $\Lambda$, the following requirement must be satisfied for the plasma to be maintained.

$$vi \geq Da/\Lambda^2$$

If a pressure P and a constant k are taken into consideration, the foregoing formula can be rewritten as follows.

$$(P\Lambda)^2 \geq k$$

Thus, the smaller the value $\Lambda$, the more difficult is it to maintain the plasma.

When the sectional area taken along the direction of propagation of the microwave is divided by N with the use of the N fins, the characteristic length $\Lambda$ can be expressed by an equation, $\Lambda = L/(\pi N)$, noting that $\Lambda = L/\pi$ if the sectional area taken along the direction of propagation of the microwave is not divided.

Accordingly, the loss of the plasma occurring between each neighboring fins can be expressed as follows.

$$Da/(L/\pi N)^2 = (Da\pi^2)N^2/L^2$$

This is in contrast to $Da/(L/\pi)^2 = (Da\pi^2)/L^2$ which is exhibited when the sectional area taken along the direction of propagation of the microwave is not divided.

Thus, it will readily be understood that the loss of the plasma which occurs when the sectional area taken along the direction of propagation of the microwave is divided by the fins will increase by a multiplication of $N^2$ as compared with that occurring when no sectional area taken along the direction of propagation of the microwave is divided.

The microwave power between each neighboring fin can be expressed by eEL/N wherein e represents the elementary electric charge of an electron and E represents the intensity of electric field. It is to be noted that, where the sectional area taken along the direction of propagation of the microwave is not divided, the microwave power will be eEL.

As can be understood from the foregoing discussion, the intervention of the plural fins on the path of travel of the microwave to divide the sectional area taken along the direction of propagation of the microwave can result in that the plasma produced by the radiation of the microwave cannot be maintained by a factor of $N^3$ within each propagation comparing with case of no fins and, also, in the vicinity of the ends of the fins adjacent the microwave outlet. Accordingly, the movement of the plasma, produced upon radiation of the microwave, in a direction counter to the direction of travel of the microwave can be restricted and the plasma will no longer shift in a direction counter to the direction of travel of the microwave, allowing the area of origin of the plasma to be substantially locked in the vicinity of the ends of the fins adjacent the microwave outlet.

In view of the foregoing, the present invention makes use of the plural fins disposed on the path of travel of the microwave in a manner spaced from each other in a direction perpendicular to the direction of travel of the microwave. The source gas can be radiated with the microwave, having passed through the interstices each defined between each neighboring fins, to produce the plasma. However, to minimize a loss of energy of the microwave which eventually radiates the source gas, each of the spaced fins must have its dimensions carefully chosen.

Specifically, as far as the thickness t of each of the spaced fins is concerned, it may be within the range of 0.2 to 5.0 mm although the respective fin having a knife edge at its ends of which opposite ends face plasma is most preferred. If the thickness of each fin is greater than an upper limit of 5 mm, and if the ends of each fin are not formed into the knife edges, the microwave will be reflected upon the associated end faces and a loss of energy will occur in the microwave passing through the interstice between the neighboring fins.

The size of the interstice or distance of separation between each neighboring fins 1, as indicated by d in FIG. 2, may be determined depending on the pressure of the source gas used within the plasma generating chamber and the power necessitated to propagate the microwave. Assuming that the pressure of the source gas within the plasma generating chamber and the intensity of the electric field of the microwave in the plasma are expressed by P and E, respectively, the distance d of separation between each neighboring fin 1 should satisfy the following relationship.

$$d < (C/PE)$$

wherein C represents a constant determined depending on the type of the source gas used.

In normal operating conditions, the distance d of separation between each neighboring fin 1 is preferably of a value not greater than 2 cm. If the distance d of separation is greater, the number N of the spaced fins used to divide the sectional area taken along the direction of propagation of the microwave will be of a reduced value and the plasma will easily be maintained between the neighboring fins. In other words, transferring position of plasma does not stop at the end of fins.

The length l of each fin 1 as measured in a direction parallel to the direction of propagation of the microwave must be of a value effective to avoid any possible generation of a standing wave of the microwave between each neighboring fins, which value can be determined depending on the wavelength of the microwave and/or the size of the plasma generated.

Each fin 1 may have its end with which the plasma may possibly contact. In addition to this possibility, there may be another possibility that the plasma may be ignited within the interstice between the neighboring fins. Therefore, each of the fins 1 used in the practice of the present invention is of a material preferred to have a resistance to heat of a high temperature, for example, not lower than 600° C.

Also, in order to minimize the loss of energy of the microwave which would occur as a result of a development of electric charge on the fins during the guidance of the microwave, each of the fins is preferred to be made of an electrically conductive material. An example of the electrically conductive material for each of the fins 1 includes a metal such as, for example, molybdenum, beryllium, copper, silver or aluminum, or an alloy such as, for example, stainless steel. Alternatively, each fin may be made of ceramics, such as, for example, aluminum oxide ($Al_2O_3$), boron nitride (BN) or zirconia ($ZrO_2$), and, in this case, each fin should have its surface electrolytically plated, or otherwise lined in any suitable manner, with an electrically conductive material such as, for example, silver or copper. Fins made of graphite may be disposed on one side of the fins which contact the plasma.

Furthermore, in the practice of the present invention, the plural fins are so disposed and so oriented that each of the fins has its surface lying perpendicular to the direction of the electric field of the propagating microwave and extending parallel to the direction of travel of the microwave.

The plural fins may be disposed either within the wave guide or within the plasma generating chamber, for example, the discharge tube.

In other words, the shape and the position of each of the fins may be determined in consideration of the sectional area taken along the direction of travel of the microwave, the shape of a portion where the fins are to be disposed and other factors. So long as the fins are so disposed and so oriented as to have their respective surfaces lying perpendicular to the direction of the electric field of the microwave and as to divide the sectional area taken along the direction of travel of the microwave, the fins may be of any suitable shape and may be disposed in any suitable manner.

Figure 3:
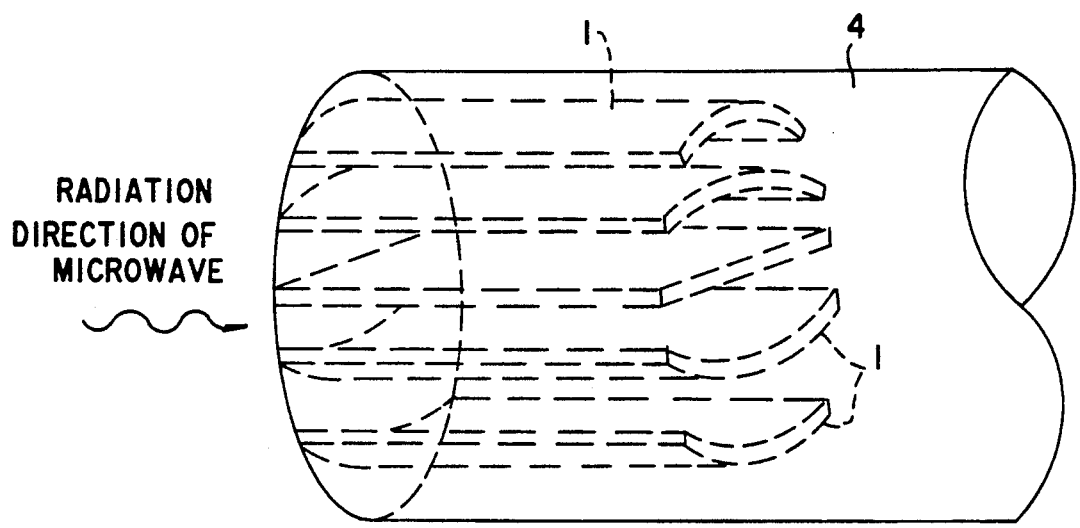
FIG. 3 is a schematic perspective view showing another example of an arrangement of the plural fins according to the present invention.
Figure 4:
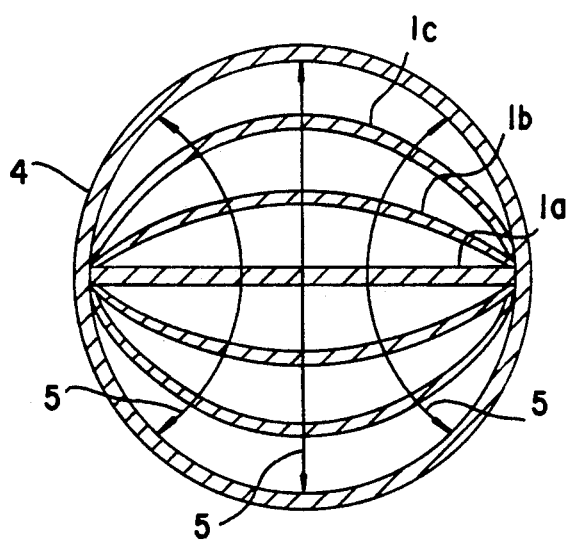
FIG. 4 is a sectional view of the plural fins shown in FIG. 3.

More specifically, where the plural fins are to be disposed within a generally rectangular-sectioned wave guide or within a generally rectangular-sectioned plasma generating chamber, each of the fins 1 would assume a shape of a flat plate as shown in FIG. 1. Alternatively, where the plural fins 1 are to be disposed within a generally round-sectioned microwave guide 4, as shown in FIG. 3, or within a generally round-sectioned plasma generating chamber, one of the fins 1 which is disposed in a plane perpendicular to the direction 5 of the electric field of the microwave and containing the longitudinal axis would assume a shape of a flat plate as indicated by 1a in FIG. 4 while the remaining fins such as indicated by 1b and 1c in FIG. 4 would assume a shape of a curved plate having a curvature increasing progressively with an increase of the distance away from the center fin 1a. In either case, each of the fins 1a, 1b and 1c is so designed as to lie perpendicular to the direction 5 of the electric field of the microwave.

Figure 5A:
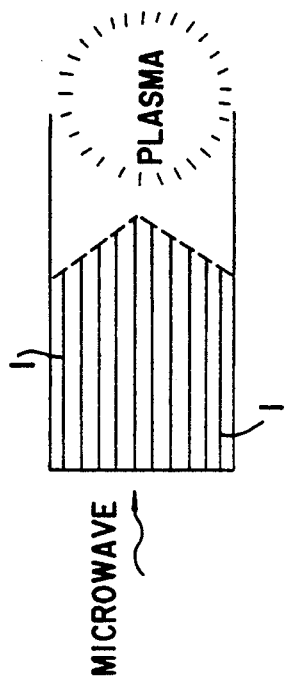
FIGS. 5(a)-5(b) and 6(a)-6(b) are schematic diagrams showing different arrangements of the plural fins according to the present invention, respectively.
Figure 5B:
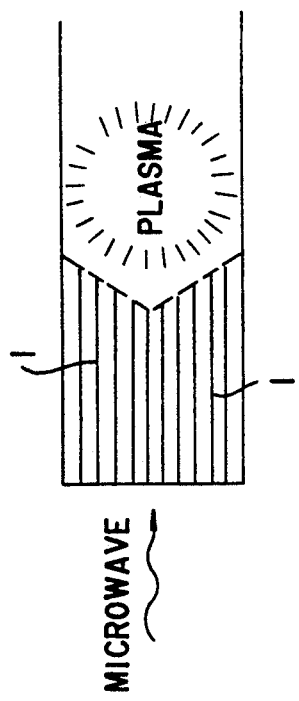
Figure 6A:
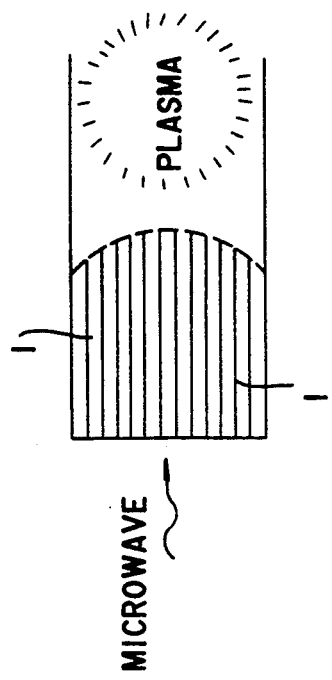
Figure 6B:
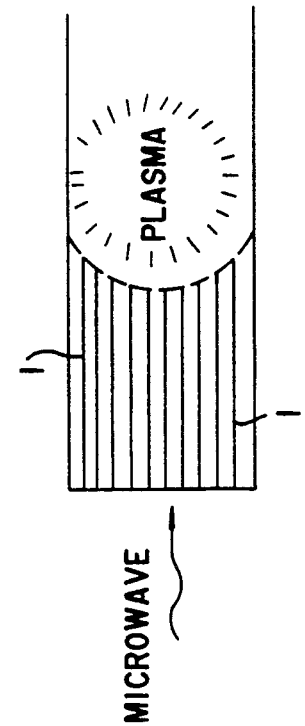

Those ends of the respective fins 1 which confront the plasma may be arranged in flush with each other in a common plane as shown in FIG. 1. Alternatively, as shown in FIG. 5(a), those ends of the respective fins 1 confronting the plasma may be arranged so as to represent either a generally V-shaped configuration with the center fin having the smallest length or a shape similar to the shape of an inverted pyramid with the center fin having the smallest length. Again alternatively, as shown in FIG. 6(a), those ends of the respective fins 1 confronting the plasma may be arranged so as to represent either a generally U-shaped configuration with the center fin having the smallest length or a generally semi-spherical shape with the center fin having the smallest length. Furthermore, the shape depicted by those ends of the respective fins 1 confronting the plasma may be reverse to that described above, in which case those ends of the respective fins 1 may protrude in a direction counter to that described above and towards the plasma as shown in FIG. 5 (b), or 6(b).

Again, the plural fins used in the practice of the present invention may not always be disposed within the microwave guide or within the plasma generating chamber, but may also be disposed within an antenna horn of a type having small-diameter and large diameter openings at opposite ends thereof, the small-diameter and large-diameter openings being communicated with the microwave outlet of the microwave guide and the plasma generating chamber, respectively. Where the antenna horn is employed, as compared with the system wherein the round-sectioned or rectangular-sectioned wave guide is merely communicated with the plasma generating chamber, not only can the spatial distribution of the intensity of the radiating electromagnetic waves be adjusted, but also the impedance matching can be improved.

The antenna horn referred to above is shown by 6 in FIG. 7. The antenna horn 6 shown therein comprises a generally rectangular-sectioned housing 9 having small-diameter and large-diameter openings defined respectively at opposite rear and front ends thereof, and small-diameter opening being coupled with the microwave outlet of the microwave guide 7 of generally rectangular cross-section through a microwave transmission window pane 8 that is made of quartz. The housing 9 has one rear end portion adjacent the microwave guide 7 which is so shaped as to flare outwardly away from the end thereof adjacent the microwave guide 7 towards a substantially intermediate portion thereof and, also, the opposite front end portion which is so shaped as to extend straight therefrom to the extremity thereof adjacent the large-diameter opening. The antenna horn 6 shown therein also comprises the plural fins 1 so disposed within the housing 9 as to lie perpendicular to the direction of the electric field of the microwave. Preferably, the respective rear ends of the fins 1 adjacent the microwave guide 7 are spaced a predetermined distance within the range of, for example, 0.5 to 40 mm from the microwave transmission window pane 8.

Alternatively, the antenna horn which may be employed in the practice of the present invention may comprise a generally round-sectioned housing having small-diameter and large-diameter openings defined respectively at opposite rear and front ends thereof and also having a rear end portion thereof flared outwardly from the small-diameter opening towards a substantially intermediate portion thereof to represent a generally conical shape while the opposite front end portion is so shaped as to extend straight therefrom towards the large-diameter opening thereby representing a generally cylindrical shape, and the plural fins 1 of the shape shown in FIG. 3 and disposed within the generally cylindrical front end portion of the round-sectioned housing so as to lie perpendicular to the direction of the electric field of the microwave. In this case, the small-diameter opening is coupled with the microwave outlet of the microwave guide of generally round cross-section through a microwave transmission window pane that is made of quartz.

Figure 8:
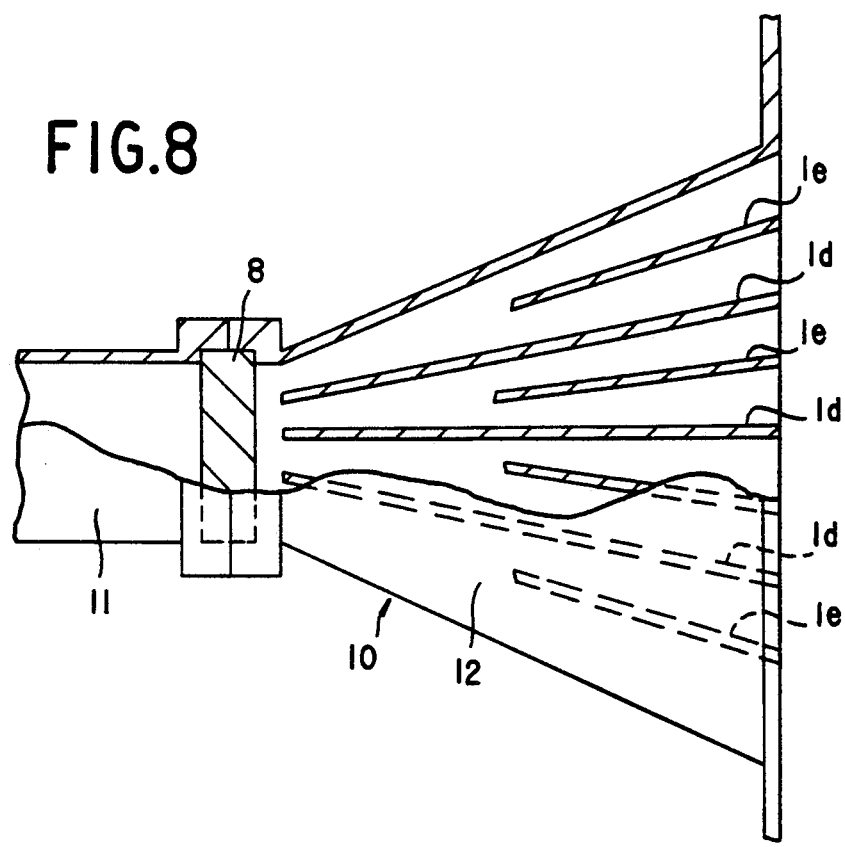
FIG. 8 is a longitudinal sectional view, with a portion cut away, showing another example of the antenna horn used in the microwave plasma generating apparatus according to the present invention.

The antenna horn shown by 10 in FIG. 8 is of a type comprising a generally rectangular-sectioned housing 12 having small-diameter and large-diameter openings defined respectively at opposite rear and front ends thereof and so shaped as to flare outwardly from the small-diameter opening towards the large-diameter opening, and alternating long and short fins 1d and 1e both disposed within the housing 12 so as to lie perpendicular to the direction of the electric field of the microwave with the long fins 1d extending substantially over the length of the rectangular-sectioned housing 12 while the short fins 1d extend from a generally intermediate portion of the housing 12 to the large-diameter opening of the housing 12. In this case, the small-diameter opening of the housing 12 is coupled with the microwave outlet of the microwave guide of generally rectangular cross-section through the microwave transmission window pane 8 made of quartz.

Even in the antenna horn 10 of the construction shown in and described with reference to FIG. 8, the respective rear ends of the long fins 1d are spaced from the microwave transmission window pane 8 a predetermined distance within the range of 0.5 to 40 mm as is the case with the antenna horn 6 shown in and described with reference to FIG. 7.

As a variant of the antenna horn 8 of the construction shown in and described with reference to FIG. 8, the present invention can make use of an antenna horn of a type comprising a generally round-sectioned housing having small-diameter and large-diameter openings defined respectively at opposite rear and front ends thereof and so shaped as to flare outwardly from the small-diameter opening towards the large-diameter opening, and alternating long and short fins both disposed within the housing so as to lie perpendicular to the direction of the electric field of the microwave with the long fins extending substantially over the length of the roundsectioned housing while the short fins extend from a generally intermediate portion of the round-sectioned housing to the large-diameter opening of the housing. In this case, the small-diameter opening of the housing is coupled with the microwave outlet of the microwave guide of generally round cross-section through the microwave transmission window pane made of quartz, and the alternating long and short fins may take a shape as shown in FIG. 3.

Hereinafter, the plasma generating apparatus according to one embodiment of the present invention in which the previously discussed fins are employed will be described.

Figure 10:
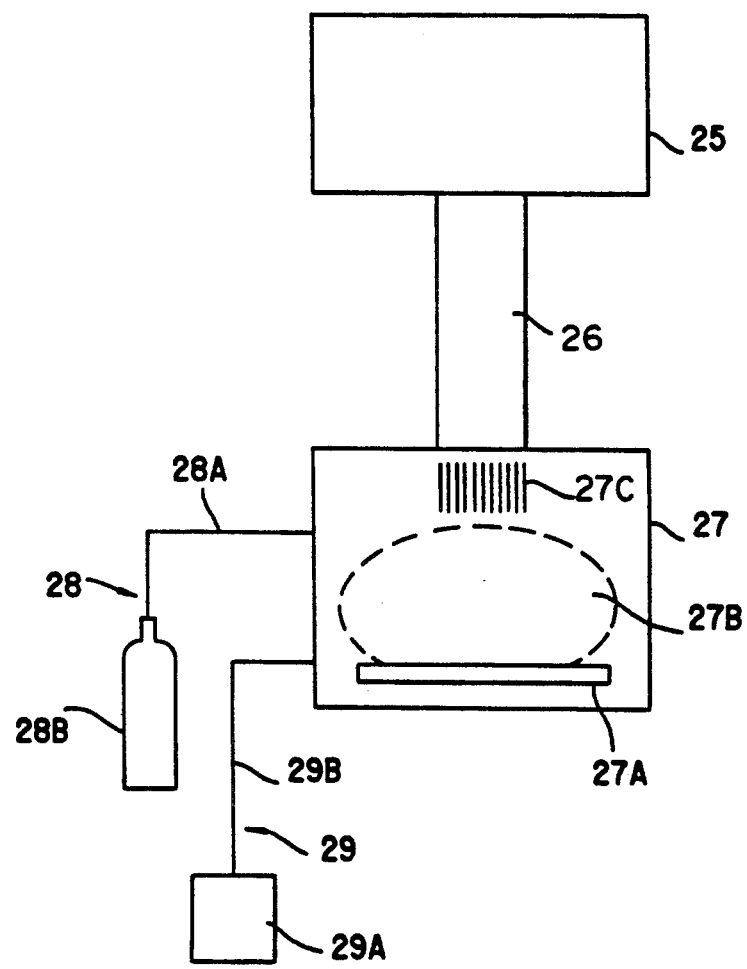
FIG. 10 is a diagram showing the microwave plasma generator according to the first preferred embodiment of the present invention.

Referring to FIG. 10, the plasma generating apparatus shown therein according to the present invention comprises a microwave oscillator 25, a microwave guide 26, a plasma generating chamber 27, a source gas supply means 28 and a evacuating means 29. The microwave oscillator 25 may be of any known construction such as, for example, Klystron, magnetron and pulsed magnetron. Of those microwave oscillators, the use of the magnetron is preferred. Although the magnetron is available in various types, either a continuous wave magnetron or a pulsed magnetron can be advantageously employed for the microwave oscillator 25 used in the microwave plasma generating apparatus of the present invention.

The pulsed magnetron is capable of generating the microwave of 300 MHz to 95 GHz at an output power of 1 kW to 5 MW. In contrast, the continuous wave magnetron is capable of generating the microwave of 800 MHz to 15 GHz at an output power of 1 kw to 100 kW.

When it comes the the microwave guide 26 used in the practice of the present invention, it may be of any known design. For example, any one of the generally rectangular-sectioned wave guide, the generally round-sectioned wave guide and the generally elliptically sectioned wave guide may be employed.

The plasma generating chamber 27 is in the form of a box formed of material such as, for example, stainless steel and aluminium alloy. As shown in FIG. 10, the box forming the plasma generating chamber 27 has a plurality of spaced fins 27c secured at opposite ends to an inner wall surface of the box and also has an opening defined therein to which the front end of the microwave guide is coupled in communication therewith. The box forming the plasma generating chamber 27 has second and third openings defined in the wall of the box. The second opening is communicated with a source gas supply piping 28A which forms a part of the raw material supply means, whereas the third opening is communicated with a vent piping 29B forming a part of the evacuating means 29 operative to evacuate the box to establish an atmosphere of reduced pressure within the box forming the plasma generating chamber 27. The wall defining the box of the plasma generating chamber 27 may have an observatory window defined at any suitable location so that an attendant worker can look into the plasma generating chamber 27 from the outside of the plasma generating chamber 27.

Again, the box forming the plasma generating chamber 27 may have a susceptor 27A disposed therein for the support of a substrate so that a suitable material can be deposited on at least one surface of the substrate by causing the plasma, generated as a result of microwave radiation to the source gas, to contact a surface of the substrate.

The plasma generating chamber 27 may not be always limited to the structure described hereinbefore, but may have any suitable structure which will be described in connection with some examples of the present invention.

The source gas supply means 28 may comprise a pressure vessel 28B containing a source gas and the raw material supply piping 28A with or without a pressure regulator. The source gas may be of any kind generally used in the prior art microwave plasma generating apparatus such as, for example, one or a mixture of air, nitrogen, oxygen, argon, hydrogen, methane, carbon oxide, carbon dioxide, alcohols, silane, disilane, diborane, geruman, carbon compound such as fluorine, chlorine and phosphorus, a sulfur compound, a hydrogen compound, a hydrogenated compound, an organic metallic compound and so on.

The evacuating means 29 comprises a vacuum pump 29A, a ventilating piping 29B connecting the vacuum pump 29A with the plasma generating chamber, and one or more pressure gases (not shown).

It is to be noted that, in FIG. 10, reference numeral 27B represents the plasma produced within the plasma generating chamber 27.

The microwave plasma generating apparatus according to the present invention is effective to ionize substantially all kinds of gases to produce the associated plasma and also to fix the position of the plasma produced within the plasma generating chamber 27.

According to the present invention, the area of origin of the plasma produced as a result of the microwave radiation can be locked in position. In addition, the present invention is advantageous in that any possible rupture of the discharge tube defining the plasma generating chamber, and the window pane disposed between the microwave guide and the plasma generating chamber can be avoided, allowing the microwave to be efficiently propagated to the plasma generating chamber. Thus, the present invention is effective to provide the microwave plasma generating apparatus of simplified construction capable of exhibiting the above discussed advantages.

Hereinafter, the present invention will be demonstrated by way of examples taken only for the purpose of illustration thereof.

EXAMPLE 1

Figure 9:
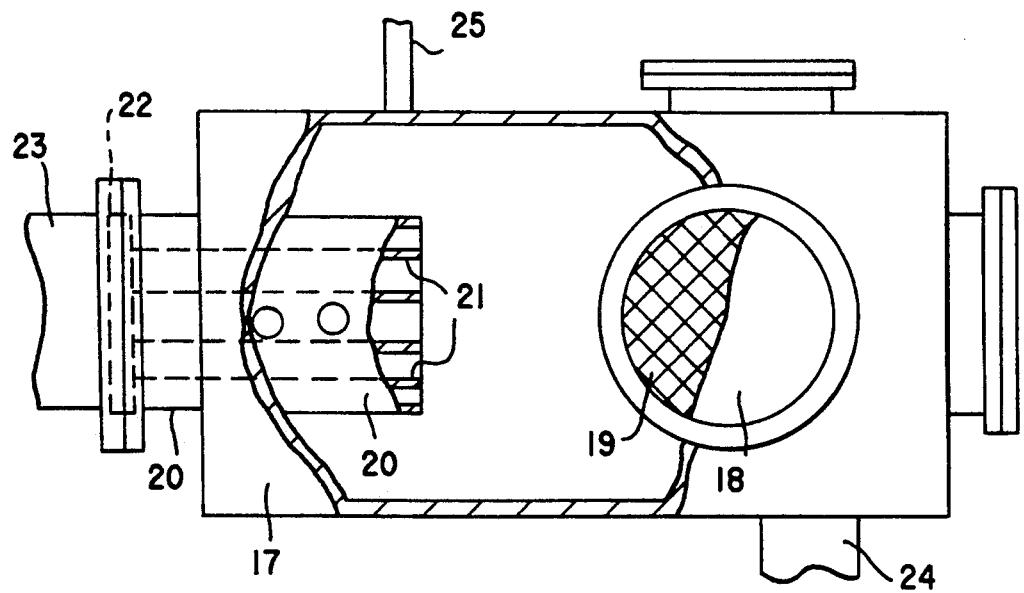
FIG. 9 is a plan view, with a portion cut away, showing the microwave plasma generating apparatus used in the practice of the first preferred embodiment of the present invention.

The plasma generating chamber of the construction shown in FIG. 9 was employed. In other words, a generally box-like vacuum chamber 17 is employed as a plasma generating chamber and has a lateral side wall provided with a look-out window 18 made of acrylic resin of 15 mm in thickness, inside of which is disposed a copper mesh 19 for avoiding any possible microwave leakage.

A generally rectangular-sectioned antenna horn 20 is coupled with one end of the vacuum chamber 17 and has four parallel fins 21 disposed therein. The antenna horn 20 has a small aperture defined therein so that an attendant worker can look into the interior of the antenna horn 20 to ascertain whether or not the plasma is being produced.

The antenna horn 20 has an end remote from the vacuum chamber 17 which is coupled with a microwave guide 23 through a quartz glass plate 22. The vacuum chamber 17 is connected with a ventilating piping 24 leading to the evacuating device and also with a source gas supply piping 25.

With the microwave power chosen to be 1 kW, the pressure inside the vacuum chamber 17 was chosen to be 10, 40 and 150 Torr and argon and air were individually employed as the respective source gases for the production of the associated plasma.

Each of the fins 21 used in the antenna horn 20 is of a size having a thickness of 0.5 mm and a length of 100 mm, the length being measured in a direction parallel to the direction of travel of the microwave.

The plasma was produced by radiating the microwave of 2.45 GHz to the source gas within the vacuum chamber 17, which microwave was supplied under these conditions through the microwave guide 23, and the area of origin of the plasma was observed.

The result of observation has indicated that the area of origin of the plasma was located in front of the opening of the antenna horn 20 adjacent the vacuum chamber 17 and no plasma was ignited within the interstice between each neighboring fins 21.

COMPARISON 1

A similar experiment to that under Example 1 was conducted under identical conditions with the use of a plasma generating apparatus similar to that used under Example 1, but having no fin disposed inside the antenna horn 20.

The result of observation of the condition in which the plasma was produced has indicated that, when the pressure inside the vacuum chamber was chosen to be 150 Torr, the plasma was produced within the antenna horn 20, that, when the pressure inside the vacuum chamber was chosen to be 40 Torr, the position of the plasma produced within the antenna horn 20 was closer to the quartz glass pane than that when the pressure inside the vacuum chamber was chosen to be 150 Torr, and that, when the pressure inside the vacuum chamber was chosen to be 10 Torr, the position where the plasma was produced was extremely closer to the quartz glass pane. Summarizing the results of observation, without the fins disposed inside the antenna horn 20, it is evident that the area of origin of the plasma has moved with a change in pressure inside the vacuum chamber.

EXAMPLE 2

Figure 11:
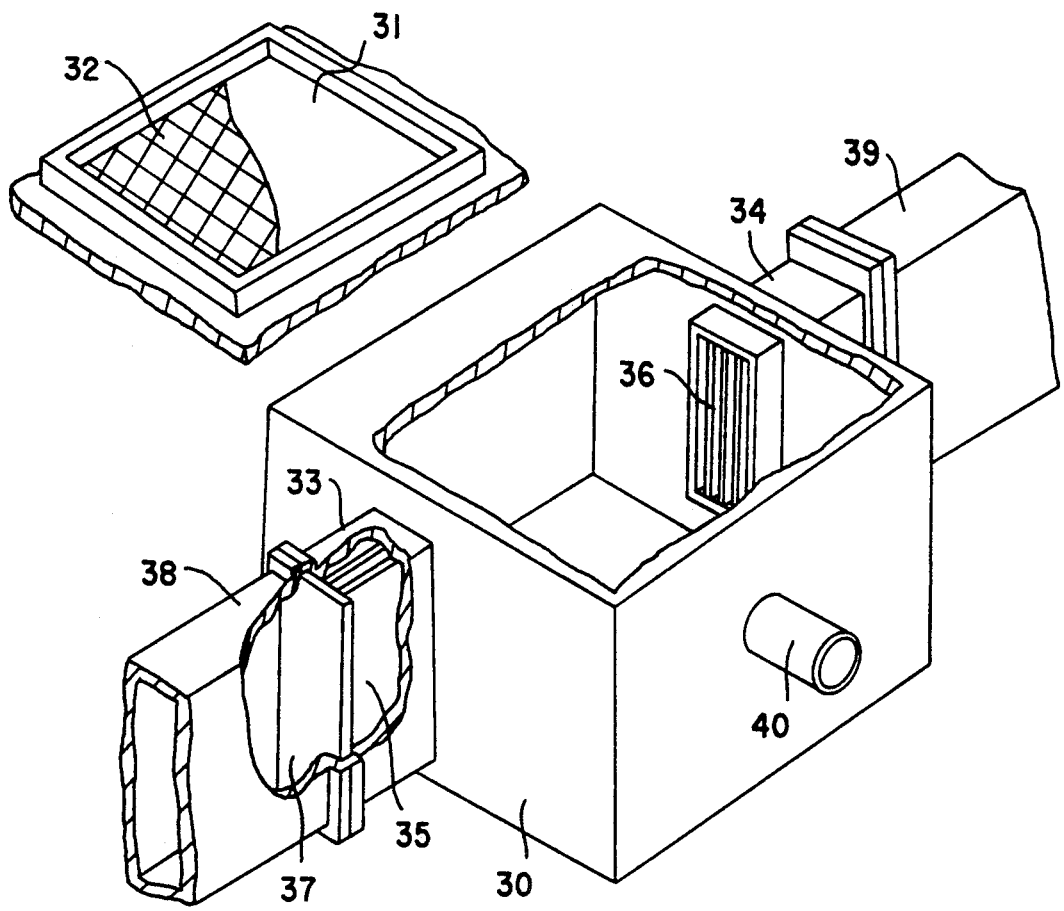
FIG. 11 is a perspective view, with a portion removed, showing the microwave plasma generating apparatus according to a second preferred embodiment of the present invention.
Figure 12:
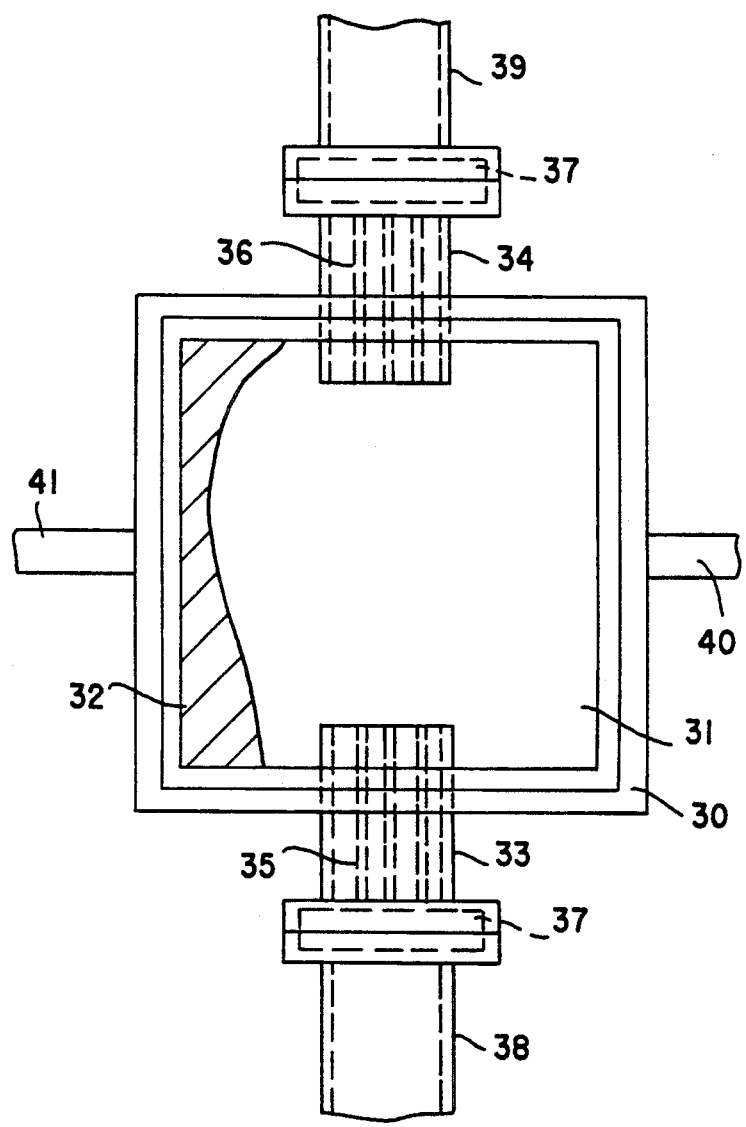
FIG. 12 is a top plan view of the microwave plasma generator shown in FIG. 11.

The plasma generating chamber of the construction shown in FIGS. 11 and 12 was employed. In other words, a generally box-like vacuum chamber 30 is employed as a plasma generating chamber and has a lateral side wall provided with a look-out window 31 made of quartz glass of 15 mm in thickness, inside of which is disposed a copper mesh 32 for avoiding any possible microwave leakage.

Generally rectangular-sectioned antenna horns 33 and 34 are coupled with opposite end walls of the vacuum chamber 17 and each antenna horns 33 and 34 has three parallel fins 35 or 36 disposed therein. Respective ends of the antenna horns 33 and 34 remote from the vacuum chamber 30 are coupled with associated microwave guides 38 and 39 through quartz glass plates 37.

The vacuum chamber 30 is connected with a ventilating piping 40 leading to the evacuating device and also with a source gas supply piping 41.

With the microwave power chosen to be 500 W, the pressure inside the vacuum chamber 30 was chosen to be 10, 40 and 150 Torr and argon and air were individually employed as the respective source gases for the production of the associated plasma.

Each of the fins 35 and 36 used in the respective antenna horns 33 and 34 is of a size having a thickness of 0.5 mm and a length of 100 mm, the length being measured in a direction parallel to the direction of travel of the microwave.

The plasma was produced by radiating the source gas within vacuum chamber 30 with the microwave of 2.45 GHz which was supplied under these conditions through the microwave guide 38, followed by radiation of the microwave of 2.45 GHz, supplied through the microwave guide 39, to the source gas within the vacuum chamber 30, and the area of origin of the plasma was observed.

The result of observation has indicated that, where the plasma was produced by radiating the source gas within the vacuum chamber 30 with the microwave supplied through the microwave guide 38, the area of origin of the plasma was located within a space delimited between the opening of the antenna horn 33 and the opening of the antenna horn 34. The size of the plasma so produced at this time was found larger than that produced by the application of only the microwave through the microwave guide 38. Even in this case, no plasma was ignited within the interstice between each neighboring fins 36.

COMPARISON 2

A similar experiment to that under Example 2 was conducted under identical conditions with the use of a plasma generating apparatus similar to that used under Example 2, but having no fins 35 or 36 disposed inside any one of the antenna horns 33 and 34.

Figure 13:
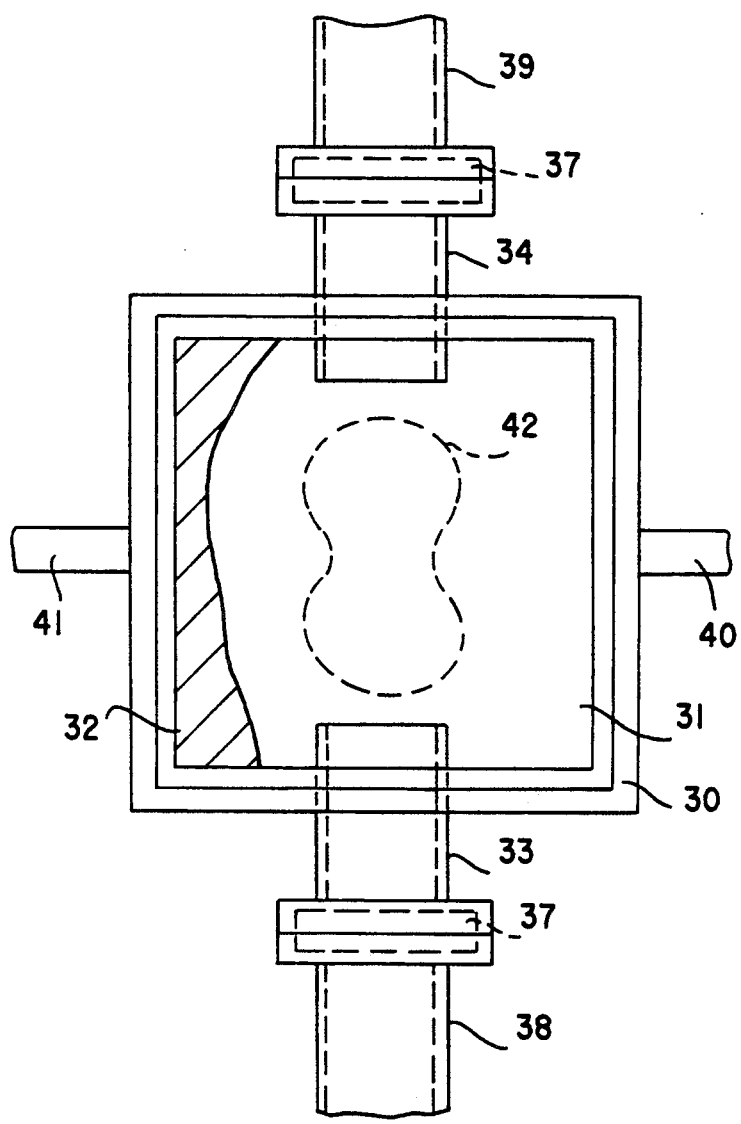
FIG. 13 is a top plan view of a microwave plasma generator similar to that shown in FIG. 11, but wherein an antenna horn having no fins is employed, illustrating the shape of a plasma generated in such microwave plasma generator.

The result of observation of the condition in which the plasma was produced has indicated that, when the microwave was radiated only through the microwave guide 38 while the pressure inside the vacuum chamber was chosen to be 150 Torr, the plasma was produced within the antenna horn having no fin, that, when the microwave was radiated only through the microwave guide 38 while the pressure inside the vacuum chamber was chosen to be 40 Torr, the position of the plasma produced within the antenna horn was closer to the quartz glass pane than that when the pressure inside the vacuum chamber was chosen to be 150 Torr, and that, when the microwave was radiated only through the microwave guide 38 while the pressure inside the vacuum chamber was chosen to be 10 Torr, the position where the plasma was produced was extremely closer to the quartz glass pane. Summarizing the results of observation, without the fins disposed inside the antenna horn, it is evident that the area of origin of the plasma has moved with a change in pressure inside the vacuum chamber.

Where the microwave was radiated through both of the microwave guides 38 and 39, as is the case with Example 2, the position where the plasma was produced was found in a space delimited between the respective openings of the antenna horns 33 and 44 both having no fin. At this time, the size of the plasma so produced was found to be larger than that of the plasma produced by the radiation of the microwave only through the microwave guide 38. However, the plasma so produced at this time was of a substantial shape necked at a location intermediate of the axis concentric with the respective longitudinal axes of the antenna horns 33 and 34 as indicated by 42 in FIG. 13.

Figure 14:
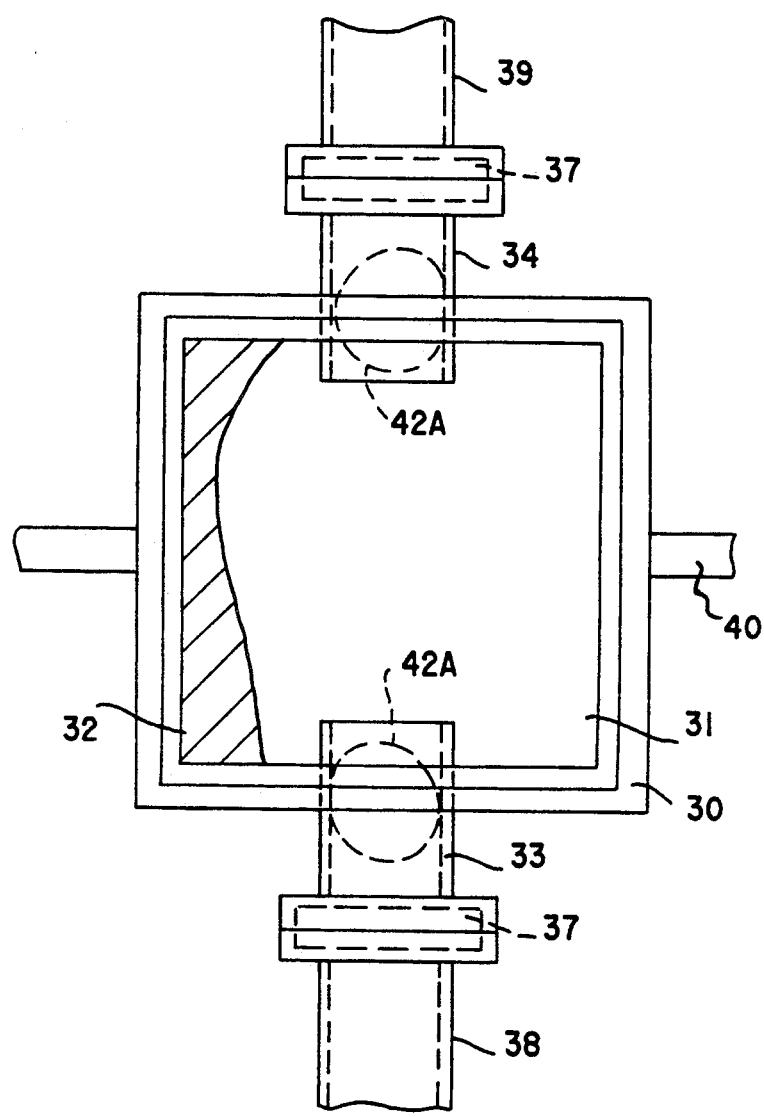
FIG. 14 is a top plan view of the microwave plasma generator, showing a change in shape of the plasma wherein the plasma are split into two components moving into respective antenna horns when the pressure is lowered.

Also, the neck 42 in the shape of the plasma were further narrowed with a decrease of the pressure of the source gas. Specifically, when the pressure attained 10 Torr, the plasma was split at 42A shown in FIG. 14 into two plasma components which were subsequently ignited within the respective antenna horns 33 and 34.

Although the present invention has been fully described in connection with the preferred embodiments thereof with reference to the accompanying drawings which are used only for the purpose of illustration, those skilled in the art will readily conceive numerous changes and modifications within the framework of obviousness upon the reading of the specification herein presented of the present invention. Accordingly, such changes and modifications are, unless they depart from the spirit and scope of the present invention as delivered from the claims annexed hereto, to be construed as included therein.

What is claimed is:

1. A microwave plasma generating apparatus comprising:
   a microwave oscillator for generating a microwave;
   a microwave guide for passage of the microwave there along from the microwave oscillator;
   a plasma generating chamber in which a source gas is radiated with the microwave to produce a plasma; and
   a plurality of spaced fins, disposed in a path of travel of the microwave, from a quartz glass plate, which is in the microwave guide, to an area of origin of the plasma within the plasma generating chamber, wherein said fins are disposed in front of an open end of the microwave guide fitted to a wall defining the plasma generating chamber and wherein the plurality of fins lie in a direction perpendicular to a direction of an electric field of the microwave and parallel to a direction of passage of the microwave.

2. A microwave plasma generating apparatus as claimed in claim 1, wherein each of said fins has a sharp edge at ends which face the plasma.

3. A microwave plasma generating apparatus as claimed in claim 1, wherein each of said fins has a thickness within a range of 0.2 to 5 mm.

4. A microwave plasma generating apparatus as claimed in claim 1, wherein each neighboring fins are spaced a distance smaller than C/PE, wherein C represents a constant determined in dependence on a type of source gas used, P represents pressure of the source gas introduced within the plasma generating chamber, and E represents intensity of the electric field of the microwave.

5. A microwave plasma generating apparatus according to claim 1 wherein said microwave guide is rectangular in section and each fin is in the shape of a flat plate.

6. A microwave plasma generating apparatus according to claim 1, wherein said microwave guide is rounded in section and a center fin is a flat plate and remaining fins have a curved shape, said curved shape increasing progressively with an increase in distance away from said center fin.

7. A microwave plasma generating apparatus according to claim 1 wherein ends of respective fins which face said plasma are arranged flush with each other in a common plane.

8. A microwave plasma generating apparatus according to claim 1 wherein ends of respective fins which face said plasma are arranged having a V-shaped configuration.

9. A microwave plasma generating apparatus according to claim 1 wherein ends of respective fins which face said plasma are arranged having a U-shaped configuration.

10. A microwave plasma generating apparatus according to claim 1 wherein ends of respective fins which face said plasma have a semi-spherical shape.

11. A microwave plasma generating apparatus comprising:
   a microwave oscillator for generating a microwave;
   a microwave guide for passage of the microwave therealong from the microwave oscillator;
   an antenna horn;
   a plasma generating chamber in which a source gas is radiated with the microwave to produce a plasma; and
   a plurality of spaced fins disposed, in a path of travel of the microwave, from a vicinity near a quartz glass plate, which is in the microwave guide, to an area of origin of the plasma within the plasma generating chamber, each fin extending across substantially an entire width and length of said antenna horn, wherein said fins are disposed within said antenna horn having a reduced-diameter opening and a large-diameter opening opposite to said reduced-diameter opening, said reduced-diameter opening being communicated with an opening of the microwave guide and said large-diameter opening being communicated with the plasma generating chamber, and wherein the plurality of fins lie in a direction perpendicular to a direction of an electric field of the microwave and parallel to a direction of passage of the microwave.

12. A microwave plasma generating apparatus according to claim 11 wherein said antenna horn is rectangular in section.

13. A microwave plasma generating apparatus according to claim 11 wherein said antenna horn is round in section.

14. A microwave plasma generating apparatus according to claim 11 wherein said plurality of fins are long fins and said apparatus further comprising a plurality of short fins alternatingly disposed in the antenna horn with said long fins.

15. A microwave plasma generating apparatus according to claim 14 wherein said long fins extend over a length of the antenna horn and said short fins extend from an intermediate portion of the antenna horn to an end of the antenna horn.

* * * * *